US010204694B2

(12) United States Patent
Zhao et al.

(10) Patent No.: US 10,204,694 B2
(45) Date of Patent: Feb. 12, 2019

(54) SHIFT REGISTER, GATE DRIVING CIRCUIT AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jian Zhao, Beijing (CN); Mo Chen, Beijing (CN); Xiong Xiong, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 31 days.

(21) Appl. No.: 15/543,957

(22) PCT Filed: Feb. 16, 2017

(86) PCT No.: PCT/CN2017/073783
§ 371 (c)(1),
(2) Date: Jul. 14, 2017

(87) PCT Pub. No.: WO2017/211094
PCT Pub. Date: Dec. 14, 2017

(65) Prior Publication Data
US 2018/0268914 A1  Sep. 20, 2018

(30) Foreign Application Priority Data

Jun. 6, 2016  (CN) .......................... 2016 1 0394120

(51) Int. Cl.
G11C 19/00 (2006.01)
G11C 19/18 (2006.01)
(Continued)

(52) U.S. Cl.
CPC .............. *G11C 19/18* (2013.01); *G11C 19/28* (2013.01); *G09G 3/3677* (2013.01); *G09G 2310/0286* (2013.01)

(58) Field of Classification Search
None
See application file for complete search history.

(56) References Cited

U.S. PATENT DOCUMENTS

2010/0220079 A1    9/2010  Bang et al.
2011/0216877 A1*   9/2011  Hsu .................... G11C 19/00
                                                    377/79
(Continued)

FOREIGN PATENT DOCUMENTS

CN    103247280 A    8/2013
CN    105632562 A    6/2016
(Continued)

OTHER PUBLICATIONS

International Search Report and Written Opinion dated Apr. 27, 2017, for corresponding PCT Application No. PCT/CN2017/073783.

*Primary Examiner* — Tuan T Lam
(74) *Attorney, Agent, or Firm* — Kinney & Lange, P.A.

(57) ABSTRACT

The embodiments of the present disclosure provide a shift register, a gate driving circuit and a display apparatus. The shift register comprises an input unit, a first reset unit, a node control unit, a gate-shaping unit, a first output unit and a second output unit. The shift register is configured to change a potential of a scan signal outputted from a driving signal output terminal, so as to produce a scan signal having a gate-shaped waveform.

20 Claims, 11 Drawing Sheets

(51) Int. Cl.
*G11C 19/28* (2006.01)
*G09G 3/36* (2006.01)

(56) References Cited

U.S. PATENT DOCUMENTS

| | | | |
|---|---|---|---|
| 2016/0195972 A1* | 7/2016 | Chen | G02F 1/13338 345/173 |
| 2017/0169757 A1* | 6/2017 | Kim | G09G 3/2092 |
| 2018/0188578 A1* | 7/2018 | Wang | G02F 1/13306 |

FOREIGN PATENT DOCUMENTS

| | | |
|---|---|---|
| CN | 105632563 A | 6/2016 |
| CN | 106098101 A | 11/2016 |
| JP | 2014010864 A | 1/2014 |

* cited by examiner

SHIFT REGISTER, GATE DRIVING CIRCUIT AND DISPLAY APPARATUS

CROSS-REFERENCE TO RELATED APPLICATION(S)

This application is a Section 371 National Stage Application of PCT International Application No. PCT/CN2017/073783, which claims priority to the Chinese Patent Application No. 201610394120.3, filed on Jun. 6, 2016, which is incorporated herein by reference in its entirety.

TECHNICAL FIELD

The present disclosure relates to display technology, and more particularly, to a backlight control method and backlight module, as well as a display apparatus comprising the backlight module.

BACKGROUND

Gate driver On Array (GOA) is a technique for integrating gate switching circuits of Thin Film Transistors (TFTs) onto an array substrate of a display panel, so as to form scanning drivers for the display panel. A conventional gate driving circuit consists of a number of cascaded shift registers and the shift register at each stage has a driving signal output terminal connected to a corresponding gate line. Scanning signals are inputted to the respective gate lines on the display panel in sequence via the shift registers at the respective stages. However, at the moment when a display transistor is switched from on to off, a large change, ΔVp, in a voltage at a pixel electrode may occur due to a large coupling capacitance between the gate and the drain of the display transistor. As a result, problems such as flickers and residual images may occur when pictures are being displayed on the display panel.

SUMMARY

The embodiments of the present disclosure provide a shift register, a gate driving circuit and a display apparatus.

Accordingly, in an embodiment of the present disclosure, a shift register is provided. The shift register comprises:

an input unit, having its first terminal connected to an input signal terminal and its second terminal connected to a first node, the input unit being configured to provide a signal at the input signal terminal to the first node under control of the input signal terminal;

a first reset unit, having its first terminal connected to a reset signal terminal, its second terminal connected to the first node, and its third terminal connected to a reference signal terminal, the first reset unit being configured to provide a signal at the reference signal terminal to the first node under control of the reset signal terminal;

a node control unit, having its first terminal connected to the first node and its second terminal connected to a second node, the node control unit being configured to make a potential at the first node and a potential at the second node opposite from each other;

a gate-shaping control unit, having its first terminal connected to a first clock signal terminal, its second terminal connected to a second clock signal terminal, its third terminal connected to a first gate-shaping control signal terminal, its fourth terminal connected to a second gate-shaping control signal terminal, and its fifth terminal connected to a first terminal of a first output unit, the gate-shaping control unit being configured to provide a signal at the first clock signal terminal to the first terminal of the first output unit under control of the first gate-shaping control signal terminal and provide a signal at the second clock signal terminal to the first terminal of the first output unit under control of the second gate-shaping control signal terminal, the signal at the first clock signal terminal having a different voltage amplitude than the signal at the second clock signal terminal;

the first output unit, having its second terminal connected to the first node and its third terminal connected to a driving signal output terminal of the shift register, the first output unit being configured to provide the signal at the first terminal of the first output unit to the driving signal output terminal under control of the first node and maintain a voltage difference between the first node and the driving signal output terminal when the first node is floating; and a second output unit, having its first terminal connected to the reference signal terminal, its second terminal connected to the second node, and its third terminal connected to the driving signal output terminal, the second output unit being configured to provide the signal at the reference signal terminal to the driving signal output terminal under control of the second node.

In an embodiment, in the above shift register, the node control unit comprises:

a first control subunit, having its first terminal connected to the reference signal terminal, its second terminal connected to the first node, and its third terminal connected to the second node, the first control subunit being configured to provide the signal at the reference signal terminal to the first node under control of the second node; and a second control subunit, having its first terminal connected to a third clock signal terminal, its second terminal connected to the reference signal terminal, its third terminal connected to the first node, and its fourth terminal connected to the second node, the second control subunit being configured to provide a signal at the third clock signal terminal to the second node under control of the third clock signal terminal only, disconnect the third clock signal terminal from the second node under joint control of the third clock signal terminal and the first node, disconnect the third clock signal terminal from the second node under control of the first node, and provide the signal at the reference signal terminal to the second node under control of the first node.

In an embodiment, in the above shift register, the first control subunit comprises a first switching transistor having its gate connected to the second node, its source connected to the reference signal terminal and its drain connected to the first node.

In an embodiment, in the above shift register, the second control subunit comprises a second switching transistor, a third switching transistor, a fourth switching transistor and a fifth switching transistor. The second switching transistor has its gate and source both connected to the third clock signal terminal and its drain connected to a gate of the third switching transistor and a drain of the fourth switching transistor. The third switching transistor has its source connected to the third clock signal terminal and its drain connected to the second node. The fourth switching transistor has its gate connected to the first node and its source connected to the reference signal terminal. The fifth switching transistor has its gate connected to the first node, its source connected to the reference signal terminal and its drain connected to the second node.

In an embodiment, in the above shift register, the input unit comprises a sixth switching transistor having its gate and source both connected to the input signal terminal and its drain connected to the first node.

In an embodiment, in the above shift register, the first reset unit comprises a seventh switching transistor having its gate connected to the reset signal terminal, its source connected to the reference signal terminal, and its drain connected to the first node.

In an embodiment, in the above shift register, the gate-shaping control unit comprises: an eighth switching transistor, having its gate connected to the first gate-shaping control signal terminal, its source connected to the first clock signal terminal, and its drain connected to the first terminal of the first output unit; and a ninth switching transistor, having its gate connected to the second gate-shaping control signal terminal, its source connected to the second clock signal terminal, and its drain connected to the first terminal of the first output unit.

In an embodiment, in the above shift register, the first output unit comprises: a tenth switching transistor, having its gate connected to the first node, its source connected to the first terminal of the first output unit, and its drain connected to the driving signal output terminal; and a capacitor, having its first terminal connected to the first node and its second terminal connected to the driving signal output terminal.

In an embodiment, in the above shift register, the second output unit comprises an eleventh switching transistor having its gate connected to the second node, its source connected to the reference signal terminal and its drain connected to the driving signal output terminal.

In an embodiment, the above shift register further comprises: a second reset unit, having its first terminal connected to the reset signal terminal, its second terminal connected to the reference signal terminal, and its third terminal connected to the driving signal output terminal, the second reset unit being configured to provide the signal at the reference signal terminal to the driving signal output terminal under control of the reset signal terminal.

In an embodiment, in the above shift register, the second reset unit comprises a twelfth switching transistor having its gate connected to the reset signal terminal, its source connected to the reference signal terminal and its drain connected to the driving signal output terminal.

In an embodiment, the above shift register further comprises: a first stabilizer unit, having its first terminal connected to the third clock signal terminal, its second terminal connected to the input signal terminal, and its third terminal connected to the first node, the first stabilizer unit being configured to provide the signal at the input signal terminal to the first node under control of the third clock signal terminal.

In an embodiment, in the above shift register, the first stabilizer unit comprises a thirteenth switching transistor having its gate connected to the third clock signal terminal, its source connected to the input signal terminal and its drain connected to the first node.

In an embodiment, the above shift register further comprises: a second stabilizer unit, having its first terminal connected to the third clock signal terminal, its second terminal connected to the reference signal terminal, and its third terminal connected to the driving signal output terminal, the second stabilizer unit being configured to provide the signal at the reference signal terminal to the driving signal output terminal under control of the third clock signal terminal.

In an embodiment, in the above shift register, the second stabilizer unit comprises a fourteenth switching transistor having its gate connected to the third clock signal terminal, its source connected to the reference signal terminal and its drain connected to the driving signal output terminal.

Accordingly, in another embodiment of the present disclosure, a gate driving circuit is provided. The gate driving circuit comprises a plurality of cascaded shift registers according to any of the above embodiments. The shift register at the first stage has its input signal terminal connected to a frame trigger signal terminal. The shift register at each stage other than the first stage has its input signal terminal connected to the driving signal output terminal of the shift register at its previous stage. The shift register at each stage other than the last stage has its reset signal terminal connected to the driving signal output terminal of the shift register at its next stage.

Accordingly, in yet another embodiment of the present disclosure, a display apparatus is provided. The display apparatus comprises the gate driving circuit according to the above embodiment.

DETAILED DESCRIPTION OF THE EMBODIMENTS

In the following, the shift register, gate driving circuit and display apparatus according to the embodiments of the present disclosure will be described in detail.

Figure 1A:
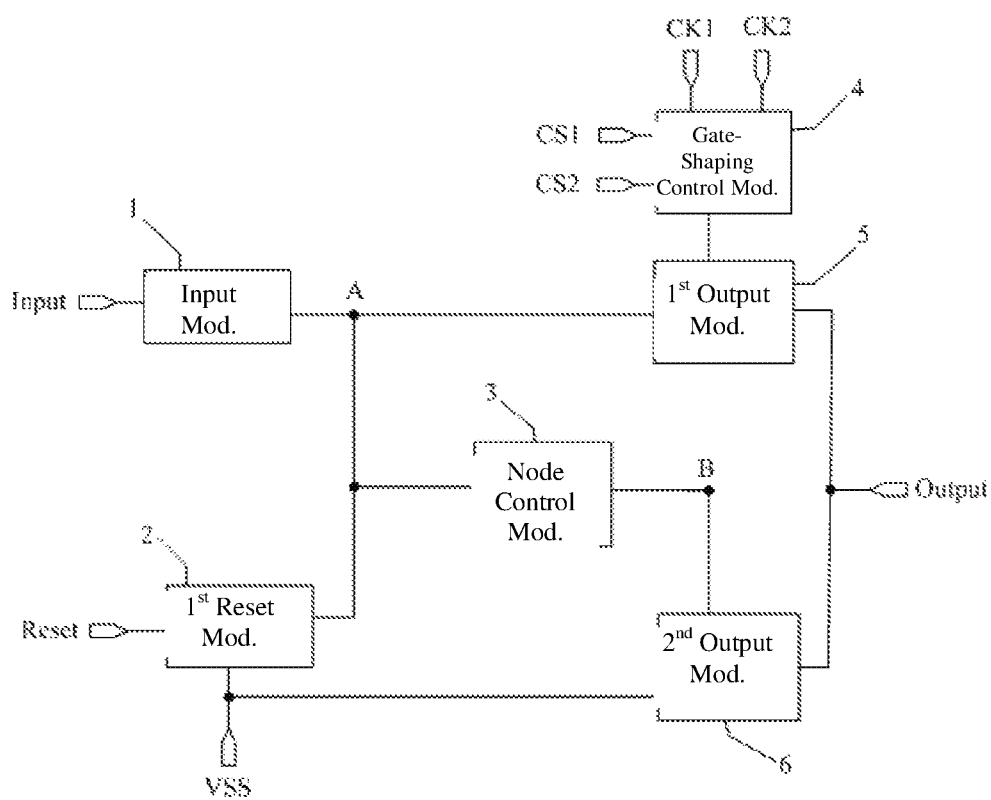
FIG. 1A is a first schematic diagram showing a structure of a shift register according to an embodiment of the present disclosure.

According to an embodiment of the present disclosure, a shift register is provided. As shown in FIG. 1A, the shift register includes: an input unit 1, a first reset unit 2, a node control unit 3, a gate-shaping control unit 4, a first output unit 5 and a second output unit 6.

The input unit 1 has its first terminal connected to an input signal terminal, Input, and its second terminal connected to a first node, A. The input unit 1 is configured to provide a signal at the input signal terminal Input to the first node A under control of the input signal terminal Input.

The first reset unit 2 has its first terminal connected to a reset signal terminal, Reset, its second terminal connected to the first node A, and its third terminal connected to a reference signal terminal, VSS. The first reset unit 2 is configured to provide a signal at the reference signal terminal VSS to the first node A under control of the reset signal terminal Reset.

The node control unit 3 has its first terminal connected to the first node A and its second terminal connected to a second node, B. The node control unit is configured to make a potential at the first node A and a potential at the second node B opposite from each other;

The gate-shaping control unit 4 has its first terminal connected to a first clock signal terminal, CK1, its second terminal connected to a second clock signal terminal, CK2, its third terminal connected to a first gate-shaping control signal terminal, CS1, its fourth terminal connected to a second gate-shaping control signal terminal, CS2, and its fifth terminal connected to a first terminal of the first output unit 5. The gate-shaping control unit 4 is configured to provide a signal at the first clock signal terminal CK1 to the first terminal of the first output unit 5 under control of the first gate-shaping control signal terminal CS1, and provide a signal at the second clock signal terminal CK2 to the first terminal of the first output unit 5 under control of the second gate-shaping control signal terminal CS2. The signal at the first clock signal terminal CK1 has a different voltage amplitude than the signal at the second clock signal terminal CK2.

The first output unit 5 having its second terminal connected to the first node A and its third terminal connected to a driving signal output terminal, Output, of the shift register. The first output unit 5 is configured to provide the signal at the first terminal of the first output unit 5 to the driving signal output terminal Output under control of the first node A, and maintain a voltage difference between the first node A and the driving signal output terminal Output when the first node A is floating.

The second output unit 6 has its first terminal connected to the reference signal terminal VSS, its second terminal connected to the second node B, and its third terminal connected to the driving signal output terminal Output. The second output unit 6 is configured to provide the signal at the reference signal terminal VSS to the driving signal output terminal Output under control of the second node B.

In the above shift register according to the embodiment of the present disclosure, the signal at the first clock signal terminal and the signal at the second clock signal terminal have opposite signal phases.

In an implementation, the larger the difference between the voltage amplitudes of the signals at the first and second clock signal terminals is, the larger the gate-shaping magnitude of the scan signal will be.

Figure 2A:
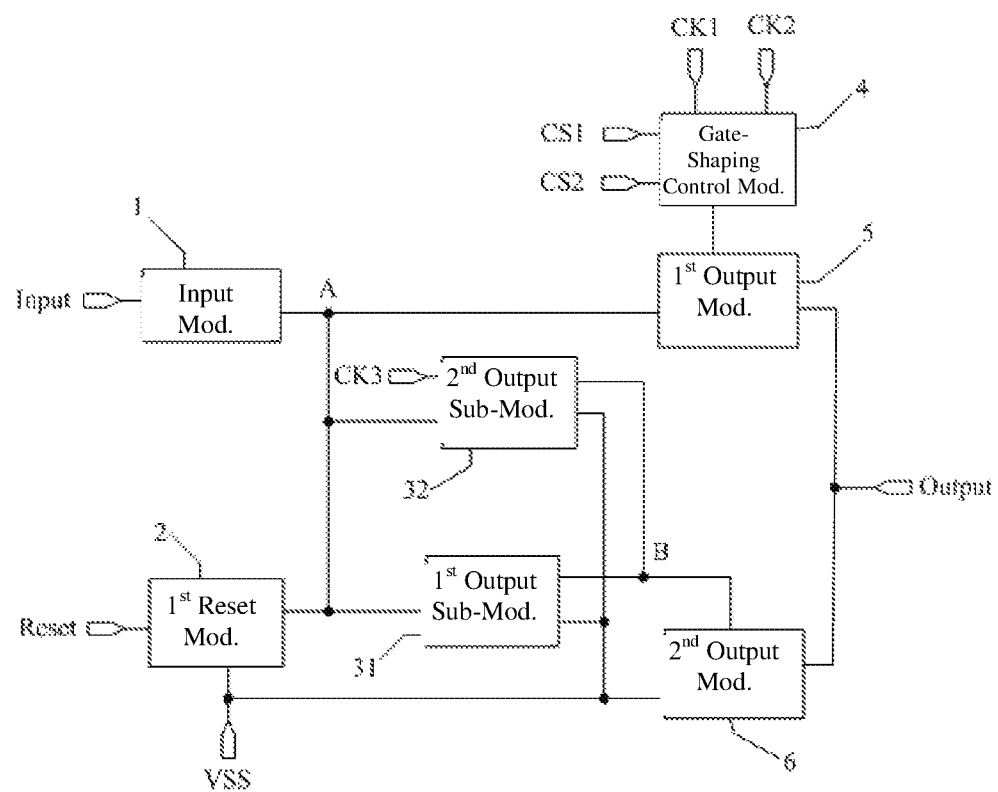
FIG. 2A is a third schematic diagram showing a structure of a shift register according to an embodiment of the present disclosure.
Figure 2B:
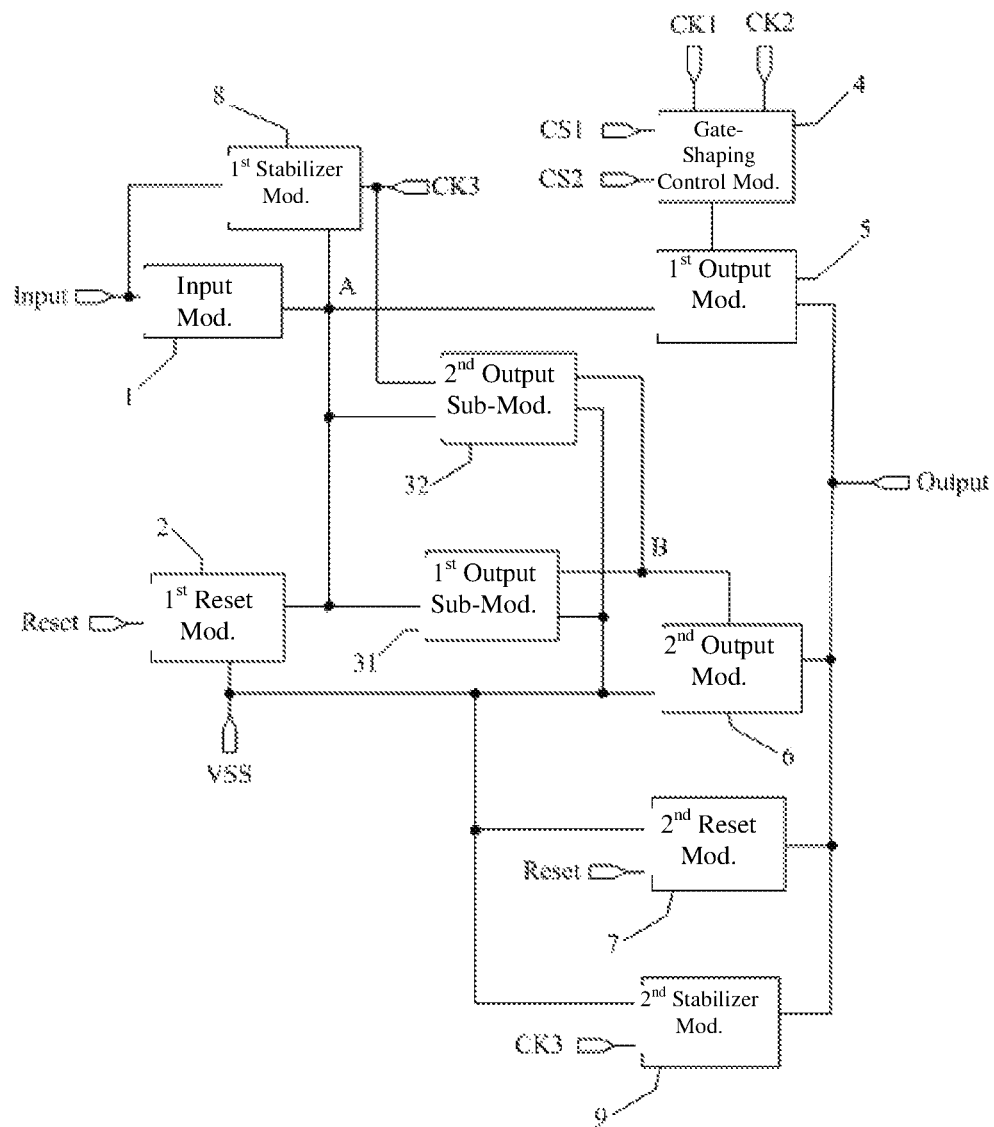
FIG. 2B is a fourth schematic diagram showing a structure of a shift register according to an embodiment of the present disclosure.

In particular, in an implementation of the above shift register according to the embodiment of the present disclosure, as shown in FIGS. 2A and 2B, the node control unit 3 can include a first control subunit 31 and a second control subunit 32.

The first control subunit 31 has its first terminal connected to the reference signal terminal VSS, its second terminal connected to the first node A and its third terminal connected to the second node B. The first control subunit 31 is configured to provide the signal at the reference signal terminal VSS to the first node A under control of the second node B.

The second control subunit 32 has its first terminal connected to a third clock signal terminal, CK3, its second terminal connected to the reference signal terminal VSS, its third terminal connected to the first node A, and its fourth terminal connected to the second node B. The second control subunit 32 is configured to provide a signal at the third clock signal terminal CK3 to the second node B under control of the third clock signal terminal CK3 only, disconnect the third clock signal terminal CK3 from the second node B under joint control of the third clock signal terminal CK3 and the first node A, disconnect the third clock signal terminal CK3 from the second node B under control of the first node A, and provide the signal at the reference signal terminal VSS to the second node B under control of the first node A.

Figure 1B:
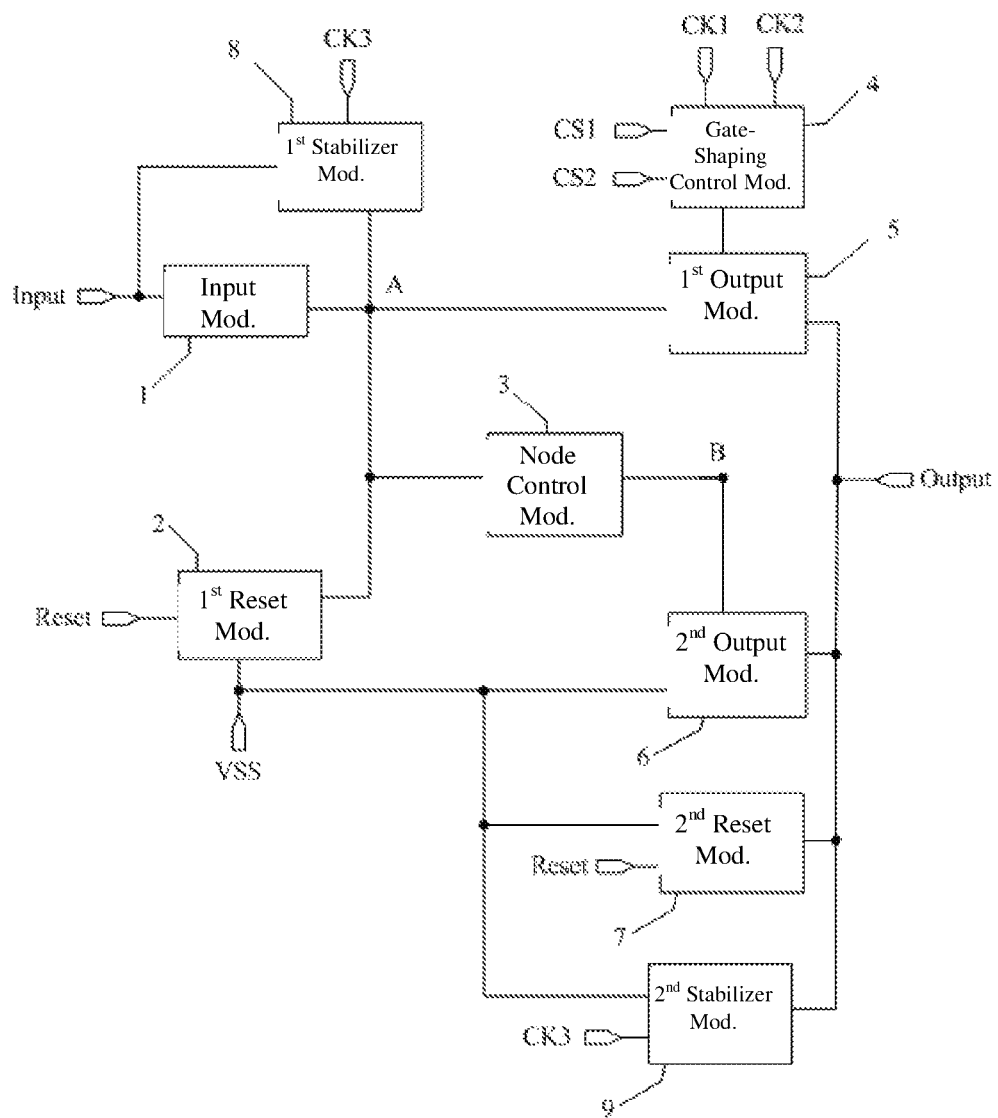
FIG. 1B is a second schematic diagram showing a structure of a shift register according to an embodiment of the present disclosure.

Further, in order to further ensure the potential at the driving signal output terminal Output to be opposite to the potential of an effective impulse signal at the input signal terminal Input timely when the output from the driving signal output terminal Output has completed, in an implementation, the above shift register according to the embodiment of the present disclosure can further include a second reset unit 7, as shown in FIGS. 1B and 2B. The second reset unit 7 has its first terminal connected to the reset signal terminal Reset, its second terminal connected to the reference signal terminal VSS, and its third terminal connected to the driving signal output terminal Output. The second reset unit 7 is configured to provide the signal at the reference signal terminal VSS to the driving signal output terminal Output under control of the reset signal terminal Reset.

Further, in order to stabilize the potential at the first node A, in an implementation, the above shift register according to the embodiment of the present disclosure can further include a first stabilizer unit 8, as shown in FIGS. 1B and 2B. The first stabilizer unit 8 has its first terminal connected to the third clock signal terminal CK3, its second terminal connected to the input signal terminal Input, and its third terminal connected to the first node A. The first stabilizer unit 8 is configured to provide the signal at the input signal terminal Input to the first node A under control of the third clock signal terminal CK3.

Further, in order to stabilize the driving signal output terminal Output, in an implementation, the above shift register according to the embodiment of the present disclosure can further include a second stabilizer unit 9, as shown in FIGS. 1B and 2B. The second stabilizer unit 9 has its first terminal connected to the third clock signal terminal CK3, its second terminal connected to the reference signal terminal VSS, and its third terminal connected to the driving signal output terminal Output. The second stabilizer unit 9 is configured to provide the signal at the reference signal terminal VSS to the driving signal output terminal Output under control of the third clock signal terminal CK3.

The details of the present disclosure will be given below with reference to the embodiments. It is to be noted here that the embodiments are provided for the purpose of illustration only, rather than limiting the present disclosure.

In particular, in the above shift register according to the embodiment of the present disclosure, as shown in FIGS. 3A to 4B, the first control subunit 31 can include a first switching transistor M1 having its gate connected to the second node B, its source connected to the reference signal terminal VSS and its drain connected to the first node A.

Figure 3A:
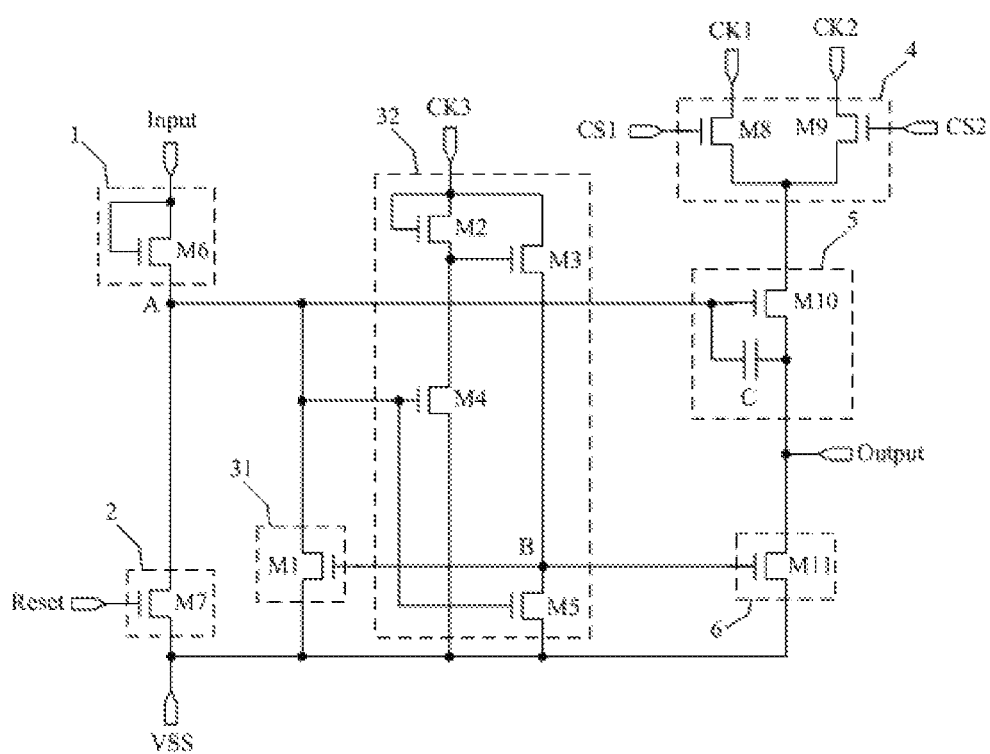
FIG. 3A is a first schematic diagram showing a specific structure of a shift register according to an embodiment of the present disclosure.
Figure 3B:
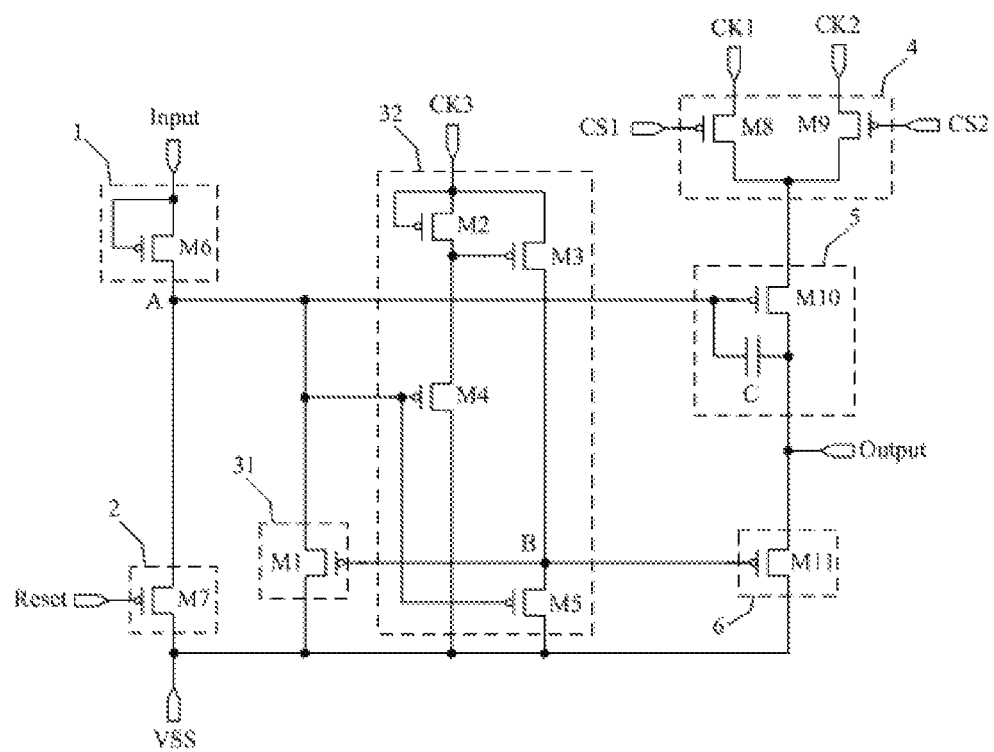
FIG. 3B is a second schematic diagram showing a specific structure of a shift register according to an embodiment of the present disclosure.
Figure 4A:
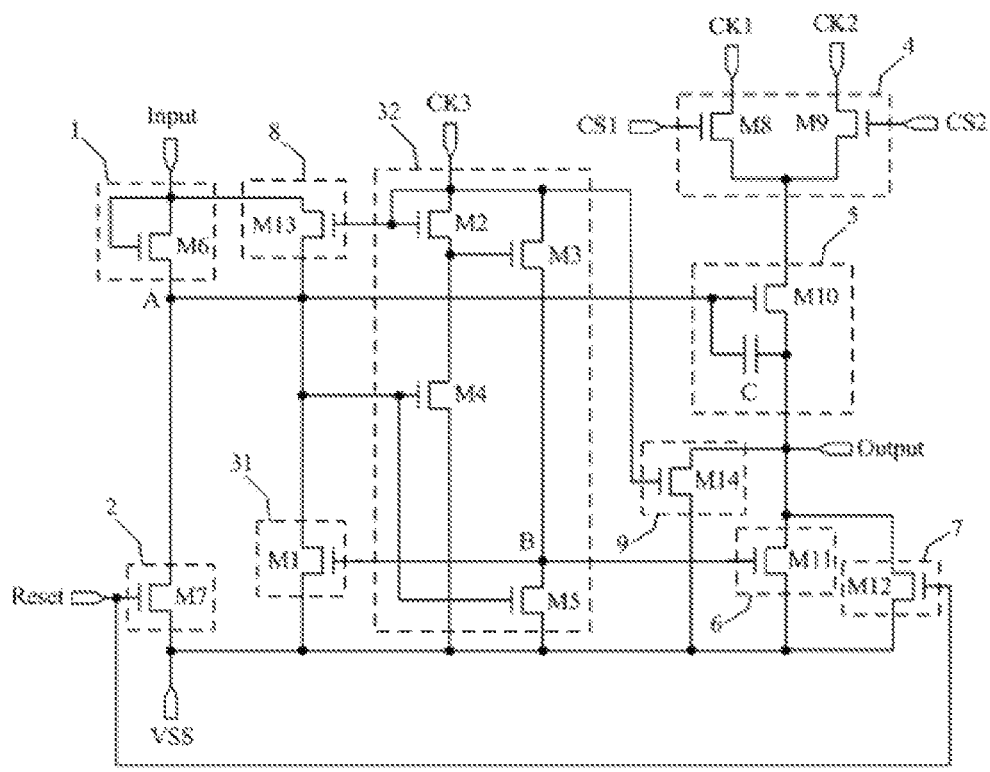
FIG. 4A is a third schematic diagram showing a specific structure of a shift register according to an embodiment of the present disclosure.
Figure 4B:
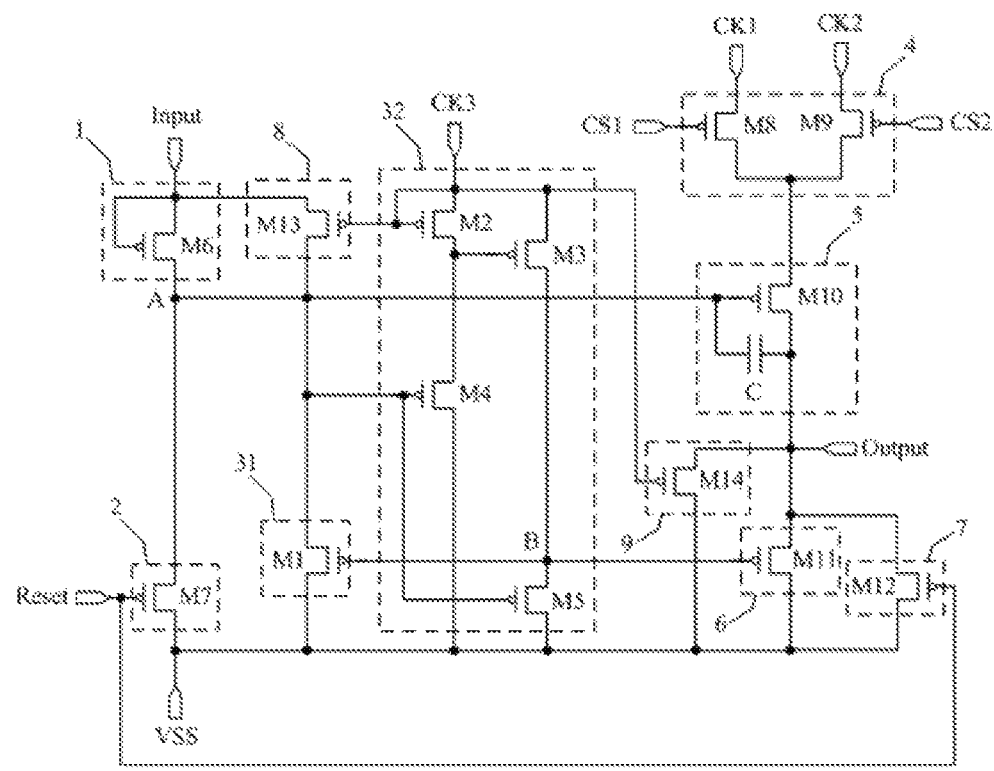
FIG. 4B is a fourth schematic diagram showing a specific structure of a shift register according to an embodiment of the present disclosure.

In an implementation of the above shift register according to the embodiment of the present disclosure, when the effective impulse signal at the input signal terminal Input is at a high level, as shown in FIGS. 3A and 4A, the first switching transistor M1 can be an N-type switching transistor. Alternatively, when the effective impulse signal at the input signal terminal Input is at a low level, as shown in FIGS. 3B and 4B, the first switching transistor M1 can be a p-type switching transistor. The present disclosure is not limited to this.

In an implementation of the above shift register according to the embodiment of the present disclosure, when the first switching transistor is on under control of the second node, it provides the signal at the reference signal terminal to the first node.

The specific structure of the first control subunit in the shift register has been described above by way of example only. In practice, the structure of the first control subunit is not limited to the structure described above in this embodiment. It can be appreciated by those skilled in the art that other structures can be used and the present disclosure is not limited to this.

In particular, in an implementation of the above shift register according to the embodiment of the present disclosure, as shown in FIGS. 3A-4B, the second control subunit 32 can include a second switching transistor M2, a third switching transistor M3, a fourth switching transistor M4 and a fifth switching transistor M5.

The second switching transistor M2 has its gate and source both connected to the third clock signal terminal CK3 and its drain connected to a gate of the third switching transistor M3 and a drain of the fourth switching transistor M4.

The third switching transistor M3 has its source connected to the third clock signal terminal CK3 and its drain connected to the second node B.

The fourth switching transistor M4 has its gate connected to the first node A and its source connected to the reference signal terminal VSS.

The fifth switching transistor M5 has its gate connected to the first node A, its source connected to the reference signal terminal VSS and its drain connected to the second node B.

In an implementation of the above shift register according to the embodiment of the present disclosure, when the effective impulse signal at the input signal terminal Input is at a high level, as shown in FIGS. 3A and 4A, the second switching transistor M2, the third switching transistor M3, the fourth switching transistor M4 and the fifth switching transistor M5 can be N-type switching transistors. Alternatively, when the effective impulse signal at the input signal terminal Input is at a low level, as shown in FIGS. 3B and 4B, the second switching transistor M2, the third switching transistor M3, the fourth switching transistor M4 and the fifth switching transistor M5 can be P-type switching transistors. The present disclosure is not limited to this.

In an implementation of the above shift register according to the embodiment of the present disclosure, when the second switching transistor is on under control of the third clock signal terminal, it provides the signal at the third clock signal terminal to the gate of the third switching transistor. When the third switching transistor is on under control of the signal at its gate, it provides the signal at the third clock signal terminal to the second node. When the fourth switching transistor is on under control of the first node, it provides the signal at the reference signal terminal to the gate of the third switching transistor. When the fifth switching transistor is on under control of the first node, it provides the signal at the reference signal terminal to the second node.

In an implementation of the above shift register according to the embodiment of the present disclosure, the size of the fifth switching transistor can be set to be larger than that of the third switching transistor during the manufacture process. In this way, when there is an effective impulse signal at the input signal terminal, the potential at the first node is the potential of the effective impulse signal at the input signal terminal, such that the fifth switching transistor, under control of the first node, provides the signal at the reference signal terminal to the second node at a rate higher than the rate at which the third switching transistor provides the signal at the third clock signal terminal to the second node under control of the signal at its gate, thereby ensuring the potential at the second node to be opposite to the potential at the first node during this phase.

The specific structure of the second control subunit in the shift register has been described above by way of example only. In practice, the structure of the second control subunit is not limited to the structure described above in this embodiment. It can be appreciated by those skilled in the art that other structures can be used and the present disclosure is not limited to this.

In particular, in the above shift register according to the embodiment of the present disclosure, as shown in FIGS. 3A-4B, the input unit 1 can include a sixth switching transistor M6 having its gate and source both connected to the input signal terminal Input and its drain connected to the first node A.

In an implementation of the above shift register according to the embodiment of the present disclosure, when the effective impulse signal at the input signal terminal Input is at a high level, as shown in FIGS. 3A and 4A, the sixth switching transistor M6 can be an N-type switching transistor. Alternatively, when the effective impulse signal at the input signal terminal Input is at a low level, as shown in FIGS. 3B and 4B, the sixth switching transistor M6 can be a P-type switching transistor. The present disclosure is not limited to this.

In an implementation of the above shift register according to the embodiment of the present disclosure, when the first switching transistor in on under control of the input signal terminal, it provides the signal at the input signal terminal to the first node.

The specific structure of the input unit in the shift register has been described above by way of example only. In practice, the structure of the input unit is not limited to the structure described above in this embodiment. It can be appreciated by those skilled in the art that other structures can be used and the present disclosure is not limited to this.

In particular, in the above shift register according to the embodiment of the present disclosure, as shown in FIGS. 3A-4B, the first reset unit 2 can include a seventh switching transistor M7 having its gate connected to the reset signal terminal Reset, its source connected to the reference signal terminal VSS, and its drain connected to the first node A.

In an implementation of the above shift register according to the embodiment of the present disclosure, as shown in FIGS. 3A-4B, the seventh switching transistor M7 can be an N-type switching transistor or a P-type switching transistor. The present disclosure is not limited to this.

In an implementation of the above shift register according to the embodiment of the present disclosure, when the seventh switching transistor is on under control of the reset signal terminal, it provides the signal at the reference signal terminal to the first node.

The specific structure of the first reset unit in the shift register has been described above by way of example only. In practice, the structure of the first reset unit is not limited to the structure described above in this embodiment. It can be appreciated by those skilled in the art that other structures can be used and the present disclosure is not limited to this.

In particular, in the above shift register according to the embodiment of the present disclosure, as shown in FIGS. 3A-4B, the gate-shaping control unit can include an eighth switching transistor M8 and a ninth switching transistor M9.

The eighth switching transistor M8 has its gate connected to the first gate-shaping control signal terminal CS1, its source connected to the first clock signal terminal CK1, and its drain connected to the first terminal of the first output unit 5.

The ninth switching transistor M9 has its gate connected to the second gate-shaping control signal terminal CS2, its source connected to the second clock signal terminal CK2, and its drain connected to the first terminal of the first output unit 5.

In an implementation of the above shift register according to the embodiment of the present disclosure, as shown in FIGS. 3A-4B, the eighth switching transistor M8 and the ninth switching transistor M9 can be N-type switching transistors or P-type switching transistors. The present disclosure is not limited to this.

In an implementation of the above shift register according to the embodiment of the present disclosure, when the eighth switching transistor is on under control of the first gate-shaping control signal terminal, it provides the signal at the first clock signal terminal to the first terminal of the first output unit. When the ninth switching transistor is on under control of the second gate-shaping control signal terminal, it provides the signal at the second clock signal terminal to the first terminal of the first output unit.

In an implementation of the above shift register according to the embodiment of the present disclosure, each of the signal at the first gate-shaping control signal terminal and the signal at the second gate-shaping control signal terminal is a clock signal having the same period as the signal at the first clock signal terminal but a different duty cycle than the latter. The signal at the first gate-shaping control signal terminal and the signal at the second gate-shaping control signal terminal have opposite phases and the sum of their duty cycles equals to 1.

When the effective impulse signal at the input signal terminal is at the high level, rising edges of the signal at the first gate-shaping control signal terminal are aligned with those of the signal at the first clock signal terminal. The duty cycle of the signal at the first gate-shaping control signal terminal is smaller than that of the signal at the first clock signal terminal, but larger than ⅝ of the latter.

When the effective impulse signal at the input signal terminal is at the low level, rising edges of the signal at the second gate-shaping control signal terminal are aligned with falling edges of the signal at the first clock signal terminal. The duty cycle of the signal at the second gate-shaping control signal terminal is smaller than that of the signal at the first clock signal terminal, but larger than ⅝ of the latter.

In an implementation of the above shift register according to the embodiment of the present disclosure, in one period of the first gate-shaping control signal terminal, the closer the duty cycle of the signal at the first gate-shaping control signal terminal is to that of the signal at the first clock signal terminal, the smaller the gate-shaping width will be in the scan signal outputted from the driving signal output terminal.

The specific structure of the gate-shaping control unit in the shift register has been described above by way of example only. In practice, the structure of the gate-shaping control unit is not limited to the structure described above in this embodiment. It can be appreciated by those skilled in the art that other structures can be used and the present disclosure is not limited to this.

In particular, in the above shift register according to the embodiment of the present disclosure, as shown in FIGS. 3A-4B, the first output unit 5 can include a tenth switching transistor M10 and a capacitor C. The tenth switching transistor M10 has its gate connected to the first node A, its source connected to the first terminal of the first output unit 5, and its drain connected to the driving signal output terminal Output. The capacitor has its first terminal connected to the first node A and its second terminal connected to the driving signal output terminal Output.

In an implementation of the above shift register according to the embodiment of the present disclosure, when the effective impulse signal at the input signal terminal Input is at a high level, as shown in FIGS. 3A and 4A, the tenth switching transistor M10 can be an N-type switching transistor. Alternatively, when the effective impulse signal at the input signal terminal Input is at a low level, as shown in FIGS. 3B and 4B, the tenth switching transistor M10 can be a P-type switching transistor. The present disclosure is not limited to this.

In an implementation of the above shift register according to the embodiment of the present disclosure, when the tenth switching transistor is on under control of the first node, it provides the signal at the first terminal of the first output unit to the driving signal output terminal. When the first node is floating, a stable voltage difference can be maintained across the capacitor due to its bootstrapping effect, i.e., a stable voltage difference can be maintained between the first node and the driving signal output terminal.

In an implementation of the above shift register according to the embodiment of the present disclosure, when the eighth switching transistor is on under control of the first gate-shaping control signal terminal, it provides the signal having a voltage amplitude of $V_{CK1}$ at the first clock signal terminal to the source of the tenth switching transistor. When the tenth switching transistor is on under control of the first node, it provides the signal having a voltage amplitude of $V_{CK1}$ at its source to the driving signal output terminal. When the ninth switching transistor is on under control of the second gate-shaping control signal terminal, it provides the signal having a voltage amplitude of $V_{CK2}$ at the second clock signal terminal to the source of the tenth switching transistor. When the tenth switching transistor is on under control of the first node, it provides the signal having a voltage amplitude of $V_{CK2}$ at its source to the driving signal output terminal.

The specific structure of the first output unit in the shift register has been described above by way of example only. In practice, the structure of the first output unit is not limited to the structure described above in this embodiment. It can be appreciated by those skilled in the art that other structures can be used and the present disclosure is not limited to this.

In particular, in the above shift register according to the embodiment of the present disclosure, as shown in FIGS. 3A-4B, the second output unit 6 can include an eleventh switching transistor M11 having its gate connected to the second node B, its source connected to the reference signal terminal VSS and its drain connected to the driving signal output terminal Output.

In an implementation of the above shift register according to the embodiment of the present disclosure, when the effective impulse signal at the input signal terminal Input is at a high level, as shown in FIGS. 3A and 4A, the eleventh switching transistor M11 can be an N-type switching transistor. Alternatively, when the effective impulse signal at the input signal terminal Input is at a low level, as shown in FIGS. 3B and 4B, the eleventh switching transistor M11 can be a P-type switching transistor. The present disclosure is not limited to this.

In an implementation of the above shift register according to the embodiment of the present disclosure, when the eleventh switching transistor is on under control of the second node, it provides the signal at the reference signal terminal to the driving signal output terminal.

The specific structure of the second output unit in the shift register has been described above by way of example only. In practice, the structure of the second output unit is not limited to the structure described above in this embodiment. It can be appreciated by those skilled in the art that other structures can be used and the present disclosure is not limited to this.

In particular, in the above shift register according to the embodiment of the present disclosure, as shown in FIGS. 4A-4B, the second reset unit 7 can include a twelfth switching transistor M12 having its gate connected to the reset signal terminal Reset, its source connected to the reference signal terminal VSS and its drain connected to the driving signal output terminal Output.

In an implementation of the above shift register according to the embodiment of the present disclosure, the twelfth switching transistor M12 can be an N-type switching transistor, as shown in FIG. 4A, or a P-type switching transistor, as shown in FIG. 4B. The present disclosure is not limited to this.

In an implementation of the above shift register according to the embodiment of the present disclosure, when the twelfth switching transistor is on under control of the reset signal terminal, it provides the signal at the reference signal terminal to the driving signal output terminal.

The specific structure of the second reset unit in the shift register has been described above by way of example only. In practice, the structure of the second reset unit is not limited to the structure described above in this embodiment. It can be appreciated by those skilled in the art that other structures can be used and the present disclosure is not limited to this.

In particular, in the above shift register according to the embodiment of the present disclosure, as shown in FIGS. 4A-4B, the first stabilizer unit 8 can include a thirteenth switching transistor M13 having its gate connected to the third clock signal terminal CK3, its source connected to the input signal terminal Input and its drain connected to the first node A.

In an implementation of the above shift register according to the embodiment of the present disclosure, when the effective impulse signal at the input signal terminal Input is at a high level, as shown in FIG. 4A, the thirteenth switching transistor M13 can be an N-type switching transistor. Alternatively, when the effective impulse signal at the input signal terminal Input is at a low level, as shown in FIG. 4B, the thirteenth switching transistor M13 can be a P-type switching transistor. The present disclosure is not limited to this.

In an implementation of the above shift register according to the embodiment of the present disclosure, when the thirteenth switching transistor is on under control of the third clock signal terminal, it provides the signal at the input signal terminal to the first node.

The specific structure of the first stabilizer unit in the shift register has been described above by way of example only. In practice, the structure of the first stabilizer unit is not limited to the structure described above in this embodiment. It can be appreciated by those skilled in the art that other structures can be used and the present disclosure is not limited to this.

In particular, in the above shift register according to the embodiment of the present disclosure, as shown in FIGS. 4A-4B, the second stabilizer unit 9 can include a fourteenth switching transistor M14 having its gate connected to the third clock signal terminal CK3, its source connected to the reference signal terminal VSS and its drain connected to the driving signal output terminal Output.

In an implementation of the above shift register according to the embodiment of the present disclosure, when the effective impulse signal at the input signal terminal Input is at a high level, as shown in FIG. 4A, the fourteenth switching transistor M14 can be an N-type switching transistor. Alternatively, when the effective impulse signal at the input signal terminal Input is at a low level, as shown in FIG. 4B, the fourteenth switching transistor M14 can be a P-type switching transistor. The present disclosure is not limited to this.

In an implementation of the above shift register according to the embodiment of the present disclosure, when the fourteenth switching transistor is on under control of the third clock signal terminal, it provides the signal at the reference signal terminal to the driving signal output terminal.

The specific structure of the second stabilizer unit in the shift register has been described above by way of example only. In practice, the structure of the second stabilizer unit is not limited to the structure described above in this embodiment. It can be appreciated by those skilled in the art that other structures can be used and the present disclosure is not limited to this.

Preferably, in order to simplify manufacture processes, in an implementation of the above shift register according to the embodiment of the present disclosure, when the effective impulse signal at the input signal terminal Input is at a high level, as shown in FIGS. 3A and 4A, all the switching transistors can be N-type switching transistors. Alternatively, when the effective impulse signal at the input signal terminal Input is at a low level, as shown in FIGS. 4A and 4B, all the switching transistors can be P-type switching transistors. The present disclosure is not limited to this.

Further, in an implementation of the above shift register according to the embodiment of the present disclosure, each N-type switching transistor is on when the high level is applied and off when the low level is applied, and each P-type switching transistor is off when the high level is applied and on when the low level is applied.

It is to be noted here that, in the above embodiments of the present disclosure, each switching transistor can be a Thin Film Transistor (TFT) or a Metal Oxide Semiconductor Field Effect Transistor (MOSFET). The present disclosure is not limited to this. In an implementation, the sources and drains of these switching transistors may be interchanged depending on the types of the respective switching transistors and the signals at the respective signal terminals. The present disclosure is not limited to this.

In the following, the operations of the above shift register according to the embodiments of the present disclosure will be described with reference to timing sequence diagrams of the circuits. Here it is assumed that the voltage amplitude at the first clock signal terminal is higher than the voltage amplitude at the second clock signal terminal. In the description below, a high level signal is represented as "1" and a low level signal is represented as "0". Here, "1" or "0" represents a logical level and is used for better illustration of the operations of the above shift register according to the embodiments of the present disclosure, rather than a potential applied on the gates of the respective switching transistors in practice.

First Embodiment

Figure 5A:
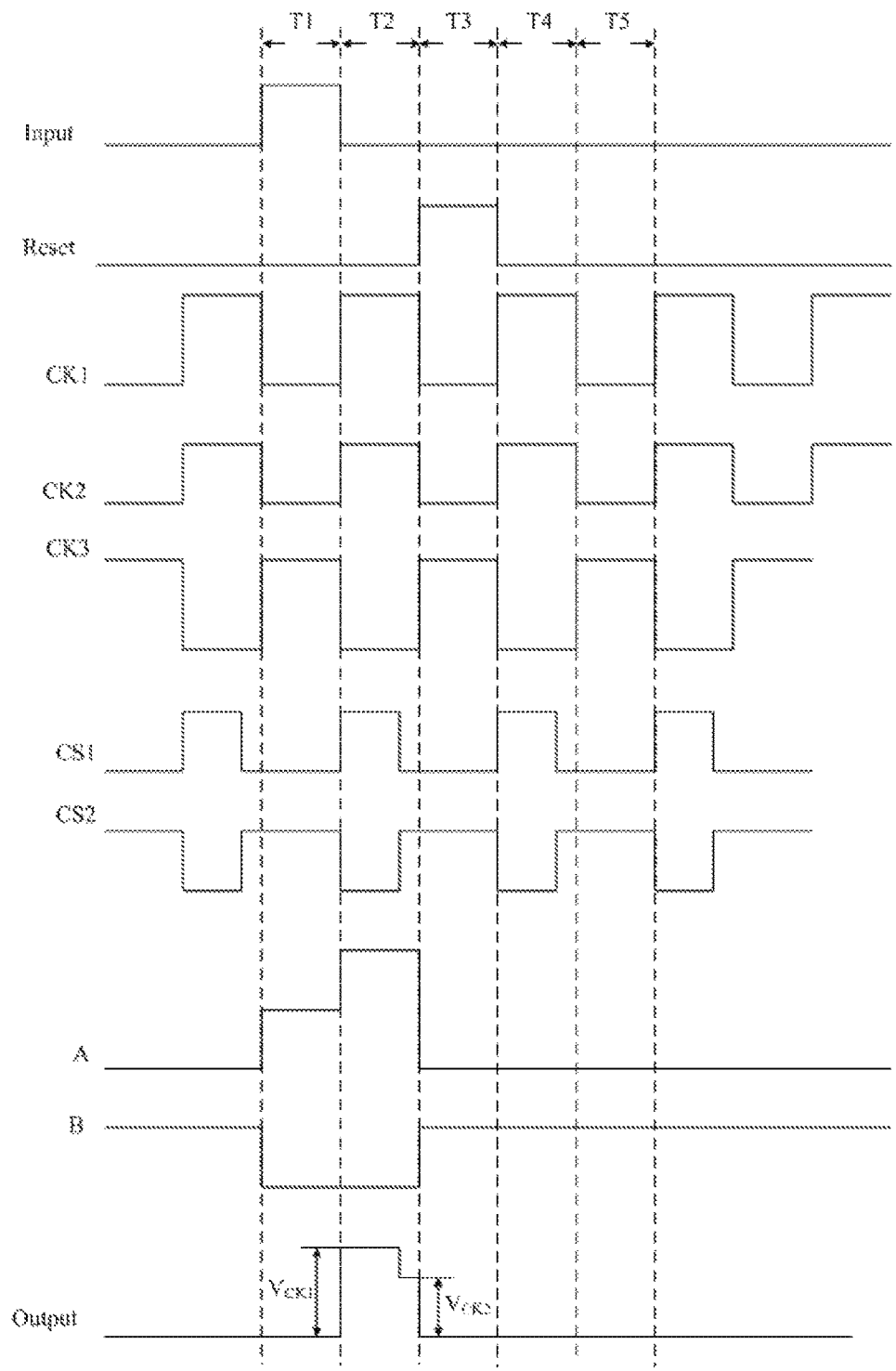
FIG. 5A is a timing sequence diagram for the shift register shown in FIG. 4A.

The operations of the shift register shown in FIG. 4A will now be described with reference to its structure. Here, in the shift register shown in FIG. 4A, all the switching transistors are N-type switching transistors. The voltage amplitude $V_{CK1}$ at the first clock signal terminal CK1 is different from the voltage amplitude $V_{CK2}$ at the second clock signal terminal CK2. The reference signal terminal VSS is at the low level. The corresponding input/output timing sequence is shown in FIG. 5A. In particular, five phases, T1, T2, T3, T4 and T5, in the input/output timing sequence shown in FIG. 5A will be described below.

In phase T1, Input=1, Reset=0, CK1=0, CK2=0, CK3=1, CS1=0 and CS2=1.

Since Reset=0, the seventh switching transistor M7 and the twelfth switching transistor M12 are both off. Since Input=1, the sixth switching transistor M6 is on and provides the high level signal at the input signal terminal Input to the first node A. As a result, the first node A is at the high level and the capacitor C begins to be charged. Since CK3=1, the second switching transistor M2, the thirteenth switching transistor M13 and the fourteenth switching transistor M14 are all on. The thirteenth switching transistor M13, which is on, provides the high level signal at the input signal terminal Input to the first node A, so as to further ensure the first node A to be at the high level. As the first node A is at the high level, the fourth switching transistor M4, the fifth switching transistor M5 and the tenth switching transistor M10 are all on. The fourth switching transistor M4, which is on, provides the low level signal at the reference signal terminal VSS to the gate of the third switching transistor M3, so as to ensure the third switching transistor M3 to be off and not to affect the potential at the second node B. The fifth switching transistor M5, which is on, provides the low level signal at the reference signal terminal VSS to the second node B, such that the second node B is at the low level, which in turn makes the first switching transistor M1 and the eleventh switching transistor M11 both off. Since CS1=0, the eighth switching transistor M8 is off. Since CS2=1, the ninth switching transistor M9 is on and provides the low level signal at the second clock signal terminal CK2 to the source of the tenth switching transistor M10. The tenth switching transistor M10 is on and provides the signal at its source to the driving signal output terminal Output, which accordingly outputs a scan signal at the low level. The fourteenth switching transistor M14, which is on, provides the low level signal at the reference signal terminal VSS to driving signal output terminal Output, so as to further ensure that the driving signal output terminal Output outputs a scan signal at the low level.

In a first period in phase T2, Input=0, Reset=0, CK1=1, CK2=1, CK3=0, CS1=1 and CS2=0.

Since Input=0, the sixth switching transistor M6 is off. Since Reset=0, the seventh switching transistor M7 and twelfth switching transistor M12 are both off. Since CK3=0, the second switching transistor M2, the thirteenth switching transistor M13 and the fourteenth switching transistor M14 are all off. As a result, the first node A is floating, such that a stable voltage difference can be maintained across the capacitor C due to its bootstrapping effect. Accordingly, the first node A is maintained at the high level, which ensures the fourth switching transistor M4, the fifth switching transistor M5 and the tenth switching transistor M10 to be all on. The fourth switching transistor M4, which is on, provides the low level signal at the reference signal terminal VSS to the gate of the third switching transistor M3, so as to ensure the third switching transistor M3 to be off. The fifth switching transistor M5, which is on, provides the low level signal at the reference signal terminal VSS to the second node B, such that the second node B is at the low level, which in turn makes the first switching transistor M1 and the eleventh switching transistor M11 both off. Since CS2=0, the ninth switching transistor M9 is off. Since CS1=1, the eighth switching transistor M8 is on and provides the high level signal at the first clock signal terminal CK1, having a voltage amplitude of $V_{CK1}$, to the driving signal output terminal Output, such that the driving signal output terminal Output outputs a high level scan signal having a voltage amplitude of $V_{CK1}$. Due to the bootstrapping effect of the capacitor C, in order to maintain the stable voltage difference across the capacitor C, the potential at the first node A is further pulled up. This ensures the tenth switching transistor M10 to be fully turned on, so as to provide the high level signal at the first clock signal terminal CK1, having the voltage amplitude of $V_{CK1}$, to the driving signal output terminal Output.

In the following second period in phase T2, Input=0, Reset=0, CK1=1, CK2=1, CK3=0, CS1=0 and CS2=1.

Since CS1=0, the eighth switching transistor M8 is off. Since CS2=1, the ninth switching transistor M9 is on and provides the high level signal at the second clock signal terminal CK2, having the voltage amplitude of $V_{CK2}$, to the source of the tenth switching transistor M10. Since the second switching transistor M2, the sixth switching transistor M6, the seventh switching transistor M7 and the thirteenth switching transistor M13 are all off, the first node A is still floating. Due to the bootstrapping effect of the capacitor C, in order to maintain the stable voltage difference across the capacitor C, the potential at the first node A is further pulled up, which ensures the tenth switching transistor M10 to be fully turned on. Since the tenth switching transistor M10 is on and provides the high level signal at the first clock signal terminal CK1, having the voltage amplitude of $V_{CK2}$, to the driving signal output terminal Output, the driving signal output terminal Output outputs a high level scan signal having a voltage amplitude of $V_{CK2}$.

In phase T3, Input=0, Reset=1, CK1=0, CK2=0, CK3=1, CS1=0 and CS2=1.

Since Input=0, the sixth switching transistor M6 is off. Since Reset=1, the seventh switching transistor M7 and twelfth switching transistor M12 are both on. The seventh switching transistor M7, which is on, provides the low level signal at the reference signal terminal VSS to the first node A, such that the first node A is at the low level. Since CK3=1, the second switching transistor M2, the thirteenth switching transistor M13 and the fourteenth switching transistor M14 are all on. The thirteenth switching transistor M13, which is on, provides the low level signal at the input signal terminal Input to the first node A, so as to further ensure the first node A to be at the low level. As the first node A is at the low level, the fourth switching transistor M4, the fifth switching transistor M5 and the tenth switching transistor M10 are all off. The second switching transistor M2, which is on, provides the high level signal at the third clock signal terminal CK3 to the gate of the third switching transistor M3, so as to ensure the third switching transistor M3 to be on. The third switching transistor M3, which is on, provides the high level signal at the third clock signal terminal CK3 to the second node B, such that the second node B is at the high level, which in turn makes the first switching transistor M1 and the eleventh switching transistor M11 both on. The first switching transistor M1, which is on, provides the low level signal at the reference signal terminal VSS to the first node A, so as to further ensure the first node A to be at the low level. The eleventh switching transistor M11, which is on, provides the low level signal at the reference signal terminal VSS to the driving signal output terminal Output, which accordingly outputs a scan signal at the low level. The twelfth switching transistor M12, which is on, provides the low level signal at the reference signal terminal VSS to driving signal output terminal Output, so as to further ensure that the driving signal output terminal Output outputs a scan signal at the low level. The fourteenth switching transistor M14, which is on, provides the low level signal at the reference signal terminal VSS to driving signal output terminal Output, so as to further ensure that the driving signal output terminal Output outputs a scan signal at the low level.

In a first period in phase T4, Input=0, Reset=0, CK1=1, CK2=1, CK3=0, CS1=1 and CS2=0.

Since Input=0, the sixth switching transistor M6 is off. Since CK3=0, the second switching transistor M2, the thirteenth switching transistor M13 and the fourteenth switching transistor M14 are all off. Since Reset=0, the seventh switching transistor M7 and twelfth switching transistor M12 are both off. As a result, the first node A will not be charged and the second node B will not be discharged. The second node B is maintained at the high level to ensure the first switching transistor M1 and the eleventh switching transistor M11 to be both on. The first switching transistor M1, which is on, provides the low level signal at the reference signal terminal VSS to the first node A, so as to ensure the first node A to be at the low level. Since the first node A is at the low level, the fourth switching transistor M4, the fifth switching transistor M5 and the tenth switching transistor M10 are all off. Since the tenth switching transistor M10 is off, the potential at the first clock signal terminal CK1 and the potential at the second clock signal CK2 will not affect the level of the scan signal outputted from the driving signal output terminal Output, regardless how the potentials at the first gate-shaping control terminal and the second gate-shaping control terminal vary. Since the eleventh switching transistor M11 is on and the provides the low level signal at the reference signal terminal VSS to driving signal output terminal Output, the driving signal output terminal Output outputs a scan signal at the low level.

In the following second period in phase T4, Input=0, Reset=0, CK1=1, CK2=1, CK3=0, CS1=0 and CS2=1.

When CS2=1, the ninth switching transistor M9 can be on to provide the high level signal at the second clock signal terminal CK2 to the source of the tenth switching transistor M10. However, since the sixth switching transistor M6 is off when Input=0, the seventh switching transistor M7 and twelfth switching transistor M12 are both off when Reset=0 and the second switching transistor M2 is off when CK3=0, the second node B is still at the high level so as to ensure the first switching transistor M1 and the eleventh switching transistor M11 to be both on. The first switching transistor M1, which is on, provides the low level signal at the reference signal terminal VSS to the first node A, so as to ensure the first node A to be at the low level. Since the first node A is at the low level, the fourth switching transistor M4, the fifth switching transistor M5 and the tenth switching transistor M10 are all off. Since the tenth switching transistor M10 is off, the potential at the first clock signal terminal CK1 and the potential at the second clock signal CK2 will not affect the level of the scan signal outputted from the driving signal output terminal Output, regardless how the potentials at the first gate-shaping control terminal and the second gate-shaping control terminal vary. Since the eleventh switching transistor M11 is on and the provides the low level signal at the reference signal terminal VSS to driving signal output terminal Output, the driving signal output terminal Output outputs a scan signal at the low level.

In phase T5, Input=0, Reset=0, CK1=0, CK2=0, CK3=1, CS1=0 and CS2=1.

Since Input=0, the sixth switching transistor M6 is off. Since Reset=0, the seventh switching transistor M7 and twelfth switching transistor M12 are both off. Since CK3=1, the second switching transistor M2, the thirteenth switching transistor M13 and the fourteenth switching transistor M14 are all on. The thirteenth switching transistor M13, which is on, provides the low level signal at the input signal terminal Input to the first node A, so as to further ensure the first node A to be at the low level. The second switching transistor M2, which is on, provides the high level signal at the third clock signal terminal CK3 to the gate of the third switching transistor M3, so as to ensure the third switching transistor M3 to be on. The third switching transistor M3, which is on, provides the high level signal at the second clock signal terminal CK2 to the second node B, such that the second node B is at the high level, which in turn makes the first switching transistor M1 and the eleventh switching transistor M11 both on. The first switching transistor M1, which is on, provides the low level signal at the reference signal terminal VSS to the first node A, so as to further ensure the first node A to be at the low level. The eleventh switching transistor M11, which is on, provides the low level signal at the reference signal terminal VSS to the driving signal output terminal Output, which accordingly outputs a scan signal at the low level. The twelfth switching transistor M12, which is on, provides the low level signal at the reference signal terminal VSS to driving signal output terminal Output, so as to further ensure that the driving signal output terminal Output outputs a scan signal at the low level.

In the above shift register according to the embodiment of the present disclosure, after phase T5, the operations of phases T4 and T5 will be repeated until the input signal terminal Input becomes high again.

In the first embodiment, in phase T2, as the signal at the first clock signal terminal and the signal at the second clock signal, having different voltage amplitudes from each other, can be provided to the driving signal output terminal, it is possible for the driving signal output terminal to output a high level scan signal having a gate-shaped waveform in this phase, so as to produce the scan signal having the gate-shaped waveform.

Second Embodiment

Figure 5B:
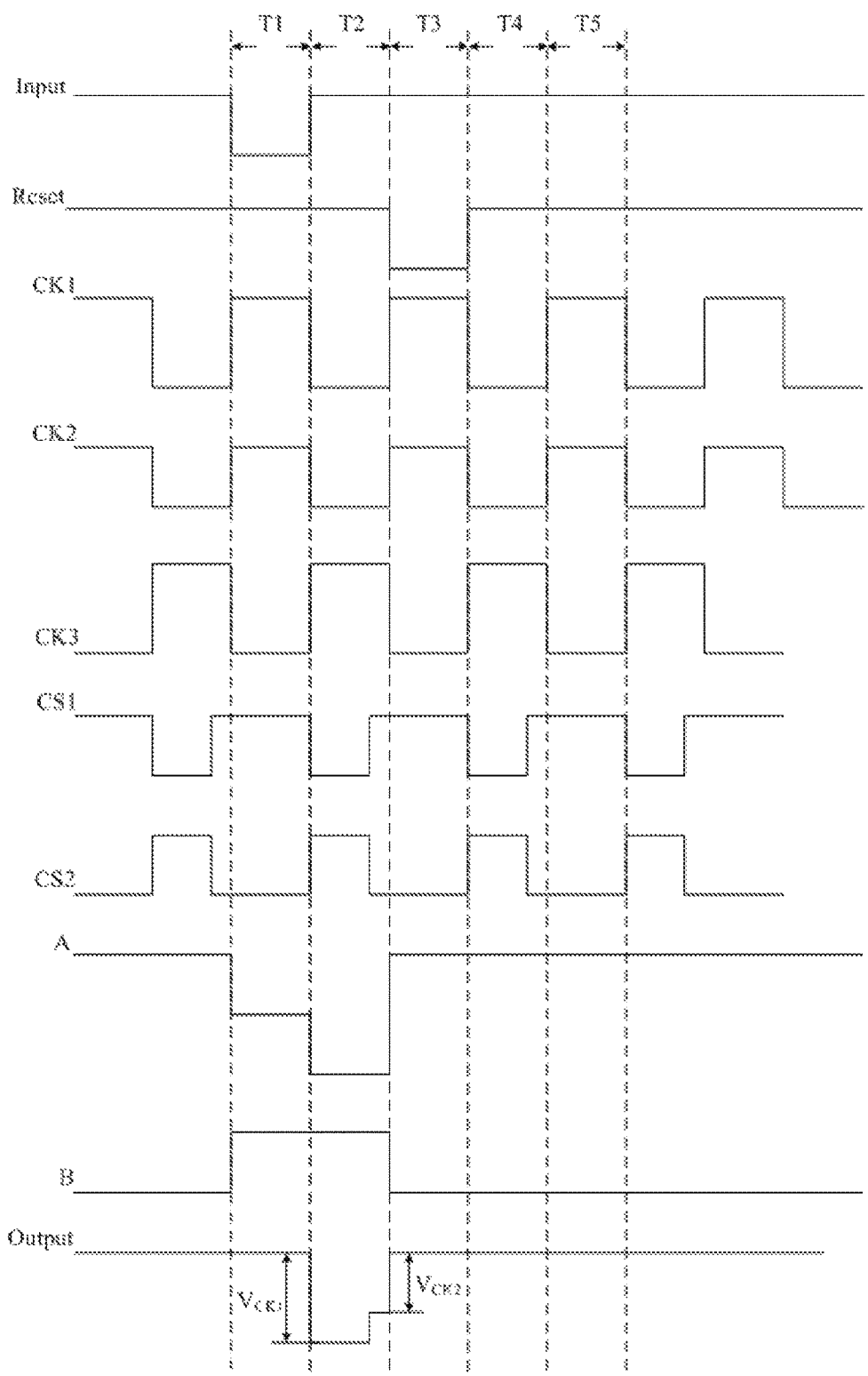
FIG. 5B is a timing sequence diagram for the shift register shown in FIG. 4B.

The operations of the shift register shown in FIG. 4B will now be described with reference to its structure. Here, in the shift register shown in FIG. 4B, all the switching transistors are P-type switching transistors. The voltage amplitude $V_{CK1}$ at the first clock signal terminal CK1 is different from the voltage amplitude $V_{CK2}$ at the second clock signal terminal CK2. The reference signal terminal VSS is at the high level. The corresponding input/output timing sequence is shown in FIG. 5B. In particular, five phases, T1, T2, T3, T4 and T5, in the input/output timing sequence shown in FIG. 5B will be described below.

In phase T1, Input=0, Reset=1, CK1=1, CK2=1, CK3=0, CS1=1 and CS2=0.

Since Reset=1, the seventh switching transistor M7 and the twelfth switching transistor M12 are both off. Since Input=0, the sixth switching transistor M6 is on and provides the low level signal at the input signal terminal Input to the first node A. As a result, the first node A is at the low level and the capacitor C begins to be charged. Since CK3=0, the second switching transistor M2, the thirteenth switching transistor M13 and the fourteenth switching transistor M14 are all on. The thirteenth switching transistor M13, which is on, provides the low level signal at the input signal terminal Input to the first node A, so as to further ensure the first node A to be at the low level. As the first node A is at the low level, the fourth switching transistor M4, the fifth switching transistor M5 and the tenth switching transistor M10 are all on. The fourth switching transistor M4, which is on, provides the high level signal at the reference signal terminal VSS to the gate of the third switching transistor M3, so as to ensure the third switching transistor M3 to be off and not to affect the potential at the second node B. The fifth switching transistor M5, which is on, provides the high level signal at the reference signal terminal VSS to the second node B, such that the second node B is at the high level, which in turn makes the first switching transistor M1 and the eleventh switching transistor M11 both off. Since CS1=1, the eighth switching transistor M8 is off. Since CS2=0, the ninth switching transistor M9 is on and provides the high level signal at the second clock signal terminal CK2 to the source of the tenth switching transistor M10. The tenth switching transistor M10 is on and provides the signal at its source to the driving signal output terminal Output, which accordingly outputs a scan signal at the high level. The fourteenth switching transistor M14, which is on, provides the high level signal at the reference signal terminal VSS to driving signal output terminal Output, so as to further ensure that the driving signal output terminal Output outputs a scan signal at the high level.

In a first period in phase T2, Input=1, Reset=1, CK1=0, CK2=0, CK3=1, CS1=0 and CS2=1.

Since Input=1, the sixth switching transistor M6 is off. Since Reset=1, the seventh switching transistor M7 and twelfth switching transistor M12 are both off. Since CK3=1, the second switching transistor M2, the thirteenth switching transistor M13 and the fourteenth switching transistor M14 are all off. As a result, the first node A is floating, such that a stable voltage difference can be maintained across the capacitor C due to its bootstrapping effect. Accordingly, the first node A is maintained at the low level, which ensures the fourth switching transistor M4, the fifth switching transistor M5 and the tenth switching transistor M10 to be all on. The fourth switching transistor M4, which is on, provides the high level signal at the reference signal terminal VSS to the gate of the third switching transistor M3, so as to ensure the third switching transistor M3 to be off. The fifth switching transistor M5, which is on, provides the high level signal at the reference signal terminal VSS to the second node B, such that the second node B is at the high level, which in turn makes the first switching transistor M1 and the eleventh switching transistor M11 both off. Since CS2=1, the ninth switching transistor M9 is off. Since CS1=0, the eighth switching transistor M8 is on and provides the low level signal at the first clock signal terminal CK1, having a voltage amplitude of $V_{CK1}$, to the driving signal output terminal Output, such that the driving signal output terminal Output outputs a low level scan signal having a voltage amplitude of $V_{CK1}$. Due to the bootstrapping effect of the capacitor C, in order to maintain the stable voltage difference across the capacitor C, the potential at the first node A is further pulled down. This ensures the tenth switching transistor M10 to be fully turned on, so as to provide the low level signal at the first clock signal terminal CK1, having the voltage amplitude of $V_{CK1}$, to the driving signal output terminal Output.

In the following second period in phase T2, Input=1, Reset=1, CK1=0, CK2=0, CK3=1, CS1=1 and CS2=0.

Since CS1=1, the eighth switching transistor M8 is off. Since CS2=0, the ninth switching transistor M9 is on and provides the low level signal at the second clock signal terminal CK2, having the voltage amplitude of $V_{CK2}$, to the source of the tenth switching transistor M10. Since the second switching transistor M2, the sixth switching transistor M6, the seventh switching transistor M7 and the thirteenth switching transistor M13 are all off, the first node A is still floating. Due to the bootstrapping effect of the capacitor C, in order to maintain the stable voltage difference across the capacitor C, the potential at the first node A is further pulled down, which ensures the tenth switching transistor M10 to be fully turned on. Since the tenth switching transistor M10 is on and provides the low level signal at the first clock signal terminal CK1, having the voltage amplitude of $V_{CK2}$, to the driving signal output terminal Output, the driving signal output terminal Output outputs a low level scan signal having a voltage amplitude of $V_{CK2}$.

In phase T3, Input=1, Reset=0, CK1=1, CK2=1, CK3=0, CS1=1 and CS2=0.

Since Input=1, the sixth switching transistor M6 is off. Since Reset=0, the seventh switching transistor M7 and twelfth switching transistor M12 are both on. The seventh switching transistor M7, which is on, provides the high level signal at the reference signal terminal VSS to the first node A, such that the first node A is at the high level. Since CK3=0, the second switching transistor M2, the thirteenth switching transistor M13 and the fourteenth switching transistor M14 are all on. The thirteenth switching transistor M13, which is on, provides the high level signal at the input signal terminal Input to the first node A, so as to further ensure the first node A to be at the high level. As the first node A is at the high level, the fourth switching transistor M4, the fifth switching transistor M5 and the tenth switching transistor M10 are all off. The second switching transistor M2, which is on, provides the low level signal at the third clock signal terminal CK3 to the gate of the third switching transistor M3, so as to ensure the third switching transistor M3 to be on. The third switching transistor M3, which is on, provides the low level signal at the third clock signal terminal CK3 to the second node B, such that the second node B is at the low level, which in turn makes the first switching transistor M1 and the eleventh switching transistor M11 both on. The first switching transistor M1, which is on, provides the high level signal at the reference signal terminal VSS to the first node A, so as to further ensure the first node A to be at the high level. The eleventh switching transistor M11, which is on, provides the high level signal at the reference signal terminal VSS to the driving signal output terminal Output, which accordingly outputs a scan signal at the high level. The twelfth switching transistor M12, which is on, provides the high level signal at the reference signal terminal VSS to driving signal output terminal Output, so as to further ensure that the driving signal output terminal Output outputs a scan signal at the high level. The fourteenth switching transistor M14, which is on, provides the high level signal at the reference signal terminal VSS to driving signal output terminal Output, so as to further ensure that the driving signal output terminal Output outputs a scan signal at the high level.

In a first period in phase T4, Input=1, Reset=1, CK1=0, CK2=0, CK3=1, CS1=0 and CS2=1.

Since Input=1, the sixth switching transistor M6 is off. Since CK3=1, the second switching transistor M2, the thirteenth switching transistor M13 and the fourteenth switching transistor M14 are all off. Since Reset=1, the seventh switching transistor M7 and twelfth switching transistor M12 are both off. As a result, the first node A will not be charged and the second node B will not be discharged. The second node B is maintained at the low level to ensure the first switching transistor M1 and the eleventh switching transistor M11 to be both on. The first switching transistor M1, which is on, provides the high level signal at the reference signal terminal VSS to the first node A, so as to ensure the first node A to be at the high level. Since the first node A is at the high level, the fourth switching transistor M4, the fifth switching transistor M5 and the tenth switching transistor M10 are all off. Since the tenth switching transistor M10 is off, the potential at the first clock signal terminal CK1 and the potential at the second clock signal CK2 will not affect the level of the scan signal outputted from the driving signal output terminal Output, regardless how the potentials at the first gate-shaping control terminal and the second gate-shaping control terminal vary. Since the eleventh switching transistor M11 is on and the provides the high level signal at the reference signal terminal VSS to driving signal output terminal Output, the driving signal output terminal Output outputs a scan signal at the high level.

In the following second period in phase T4, Input=1, Reset=1, CK1=0, CK2=0, CK3=1, CS1=1 and CS2=0.

When CS2=0, the ninth switching transistor M9 can be on to provide the low level signal at the second clock signal terminal CK2 to the source of the tenth switching transistor M10. However, since the sixth switching transistor M6 is off when Input=1, the seventh switching transistor M7 and twelfth switching transistor M12 are both off when Reset=1 and the second switching transistor M2 is off when CK3=1, the second node B is still at the low level so as to ensure the first switching transistor M1 and the eleventh switching transistor M11 to be both on. The first switching transistor M1, which is on, provides the high level signal at the reference signal terminal VSS to the first node A, so as to ensure the first node A to be at the high level. Since the first node A is at the high level, the fourth switching transistor M4, the fifth switching transistor M5 and the tenth switching transistor M10 are all off. Since the tenth switching transistor M10 is off, the potential at the first clock signal terminal CK1 and the potential at the second clock signal CK2 will not affect the level of the scan signal outputted from the driving signal output terminal Output, regardless how the potentials at the first gate-shaping control terminal and the second gate-shaping control terminal vary. Since the eleventh switching transistor M11 is on and the provides the high level signal at the reference signal terminal VSS to driving signal output terminal Output, the driving signal output terminal Output outputs a scan signal at the high level.

In phase T5, Input=1, Reset=1, CK1=1, CK2=1, CK3=0, CS1=1 and CS2=0.

Since Input=1, the sixth switching transistor M6 is off. Since Reset=1, the seventh switching transistor M7 and twelfth switching transistor M12 are both off. Since CK3=0, the second switching transistor M2, the thirteenth switching transistor M13 and the fourteenth switching transistor M14 are all on. The thirteenth switching transistor M13, which is on, provides the high level signal at the input signal terminal Input to the first node A, so as to further ensure the first node A to be at the high level. The second switching transistor M2, which is on, provides the low level signal at the third clock signal terminal CK3 to the gate of the third switching transistor M3, so as to ensure the third switching transistor M3 to be on. The third switching transistor M3, which is on, provides the low level signal at the second clock signal terminal CK2 to the second node B, such that the second node B is at the low level, which in turn makes the first switching transistor M1 and the eleventh switching transistor M11 both on. The first switching transistor M1, which is on, provides the high level signal at the reference signal terminal VSS to the first node A, so as to further ensure the first node A to be at the high level. The eleventh switching transistor M11, which is on, provides the high level signal at the reference signal terminal VSS to the driving signal output terminal Output, which accordingly outputs a scan signal at the high level. The twelfth switching transistor M12, which is on, provides the high level signal at the reference signal terminal VSS to driving signal output terminal Output, so as to further ensure that the driving signal output terminal Output outputs a scan signal at the high level.

In the above shift register according to the embodiment of the present disclosure, after phase T5, the operations of phases T4 and T5 will be repeated until the input signal terminal Input becomes low again.

In the second embodiment, in phase T2, as the signal at the first clock signal terminal and the signal at the second clock signal, having different voltage amplitudes from each other, can be provided to the driving signal output terminal, it is possible for the driving signal output terminal to output a low level scan signal having a gate-shaped waveform in this phase, so as to produce the scan signal having the gate-shaped waveform.

Figure 6:
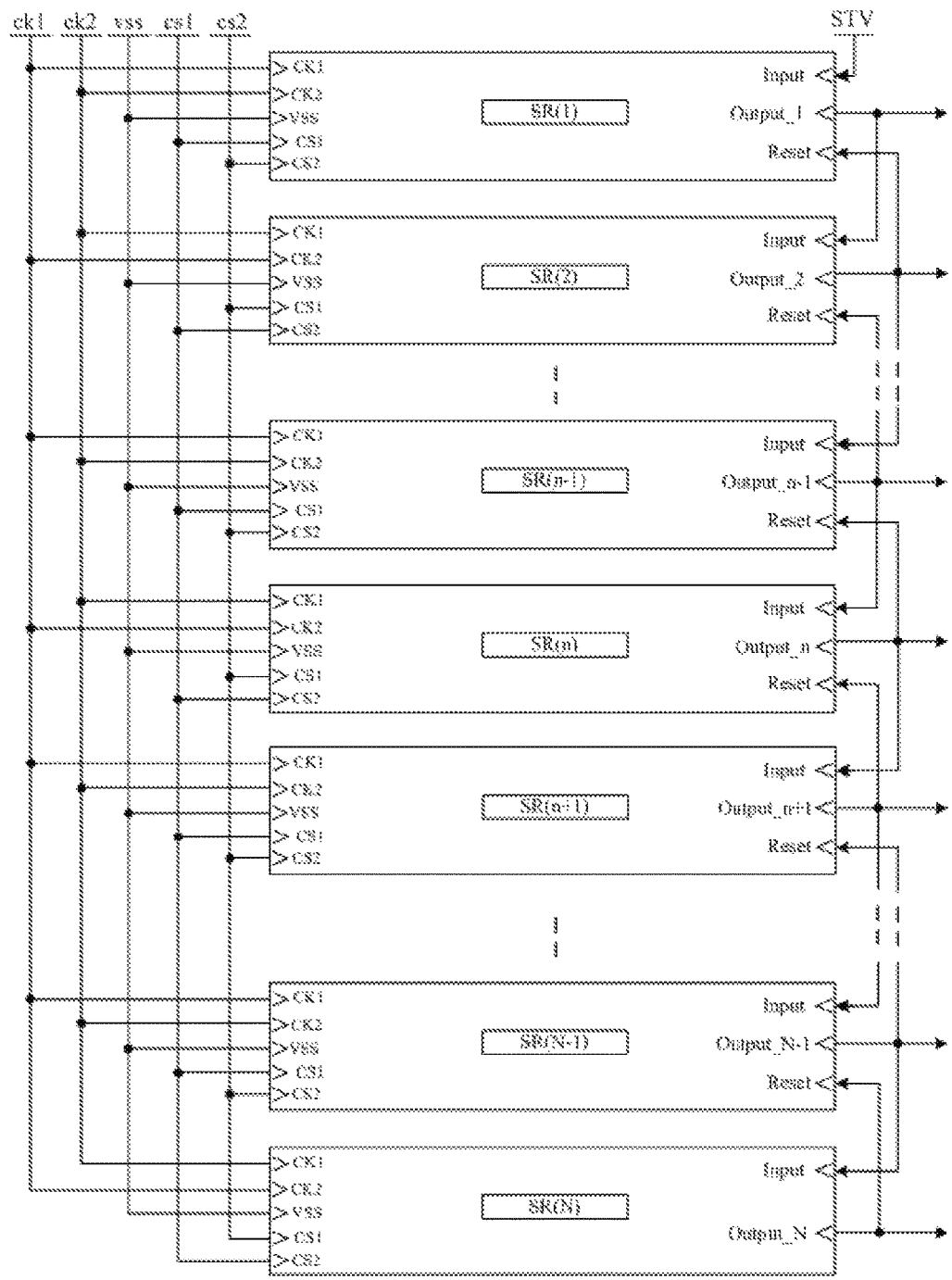
FIG. 6 is a schematic diagram showing a structure of a gate driving circuit according to an embodiment of the present disclosure.

Based on the same inventive concept, in an embodiment of the present disclosure, a gate driving circuit is provided. As shown in FIG. 6, the gate driving circuit includes a plurality of cascaded shift registers, SR(1), SR(2), ... SR(n−1), SR(n), SR(n+1), ... SR(N−1), SR(N). There are in total N shift registers, where 1≤n≤N.

The shift register SR(1) at the first stage has its input signal terminal Input connected to a frame trigger signal terminal STV.

The shift register SR(n) at each stage other than the first stage SR(1) has its input signal terminal Input connected to the driving signal output terminal Output_n−1 of the shift register SR(n−1) at its previous stage.

The shift register SR(n) at each stage other than the last stage SR(N) has its reset signal terminal Reset connected to the driving signal output terminal Output_n+1 of the shift register at its next stage SR(n+1).

In particular, each of the shift registers in the above gate driving circuit has the same function and structure as any of the above shift registers according to the embodiments of the present disclosure, and the description thereof will thus be omitted here.

In an implementation of the above gate driving circuit according to the embodiment of the present disclosure, as shown in FIG. 6, the reference signal terminal VSS of each of the shift registers is connected to one single reference signal control terminal, vss. The first clock signal terminal CK1 of the shift register at stage 2 k−1 and the second clock signal terminal CK2 of the shift register at stage 2 k are both connected to one clock terminal, i.e., a first clock terminal ck1. The second clock signal terminal CK2 of the shift register at stage 2 k−1 and the first clock signal terminal CK1 of the shift register at stage 2 k are both connected to one clock terminal, i.e., a second clock terminal ck2. Here, k is an integer larger than 0.

In an implementation of the above gate driving circuit according to the embodiment of the present disclosure, a first gate-shaping control terminal and a second gate-shaping control terminal provide gate-shaping control signals to the first gate-shaping control signal terminal and the second gate-shaping control signal terminal of the shift registers at the respective stages, so as to enable the shift registers at the respective stages to output scan signals having gate-shaped waveforms.

Preferably, in order to simplify the structure of the circuit, the signals at the first gate-shaping control signal terminal and the second gate-shaping control signal terminal are clock signals having the same period as the signal at the first clock signal terminal. In an implementation of the above gate driving circuit according to the embodiment of the present disclosure, the first gate-shaping control signal terminal CS1 of the shift register at stage 2 k−1 and the second gate-shaping control signal terminal CS2 of the shift register at stage 2 k are both connected to one gate-shaping signal terminal, i.e., a first gate-shaping signal terminal cs1. The second gate-shaping control signal terminal CS2 of the shift register at stage 2 k−1 and the first gate-shaping control signal terminal CS2 of the shift register at stage 2 k are both connected to one gate-shaping signal terminal, i.e., a second gate-shaping signal terminal cs2. Here, the signal outputted from the first gate-shaping signal terminal cs1 and the signal outputted from the second gate-shaping signal terminal cs2 have the same period but opposite phases, and the sum of their duty cycles equals to 1. In this way, only two signal lines, which are connected to the first gate-shaping control signal terminal and the second gate-shaping control signal terminal of the shift registers at the respective stages in the gate driving circuit, are required for providing signals to enable the shift registers at the respective stages in the gate driving circuit to output scan signals having gate-shaped waveforms, such that the circuit design can be simplified.

Based on the same inventive concept, in an embodiment of the present disclosure, a display apparatus is provided. The display apparatus includes the above gate driving circuit according to the embodiment of the present disclosure. With the gate driving circuit, respective gate lines in the display panel of the display apparatus can be provided with scan signals having gate-shaped waveforms. Reference can be made to the above embodiments of the shift register and the details thereof will be omitted here. The display apparatus can be e.g., a mobile phone, a tablet computer, a television, a display, a laptop computer, a digital frame, a navigator, or any product or component having a display function. It can be appreciated by those skilled in the art that the display apparatus may have other necessary components, and the description thereof will be omitted here and is not intended to limit the scope of the present disclosure.

Obviously, various modifications and alternatives can be made by those skilled in the art without departing from the spirit and scope of the present disclosure. These modifications and alternatives are to be encompassed by the scope of the present disclosure if they fall into the scope of the claims as attached and the equivalents thereof.

What is claimed is:

1. A shift register, comprising:
   an input unit, having its first terminal connected to an input signal terminal and its second terminal connected to a first node, the input unit being configured to provide a signal at the input signal terminal to the first node under control of the input signal terminal;
   a first reset unit, having its first terminal connected to a reset signal terminal, its second terminal connected to the first node, and its third terminal connected to a reference signal terminal, the first reset unit being configured to provide a signal at the reference signal terminal to the first node under control of the reset signal terminal;
   a node control unit, having its first terminal connected to the first node and its second terminal connected to a second node, the node control unit being configured to make a potential at the first node and a potential at the second node opposite from each other;
   a gate-shaping control unit, having its first terminal connected to a first clock signal terminal, its second terminal connected to a second clock signal terminal, its third terminal connected to a first gate-shaping control signal terminal, its fourth terminal connected to a second gate-shaping control signal terminal, and its fifth terminal connected to a first terminal of a first output unit, the gate-shaping control unit being configured to provide a signal at the first clock signal terminal to the first terminal of the first output unit under control of the first gate-shaping control signal terminal and provide a signal at the second clock signal terminal to the first terminal of the first output unit under control of the second gate-shaping control signal terminal, the signal at the first clock signal terminal having a different voltage amplitude than the signal at the second clock signal terminal;
   the first output unit, having its second terminal connected to the first node and its third terminal connected to a driving signal output terminal of the shift register, the first output unit being configured to provide the signal at the first terminal of the first output unit to the driving signal output terminal under control of the first node and maintain a voltage difference between the first node and the driving signal output terminal when the first node is floating; and
   a second output unit, having its first terminal connected to the reference signal terminal, its second terminal connected to the second node, and its third terminal connected to the driving signal output terminal, the second output unit being configured to provide the signal at the reference signal terminal to the driving signal output terminal under control of the second node.

2. The shift register of claim 1, wherein the node control unit comprises:
   a first control subunit, having its first terminal connected to the reference signal terminal, its second terminal connected to the first node, and its third terminal connected to the second node, the first control subunit being configured to provide the signal at the reference signal terminal to the first node under control of the second node; and
   a second control subunit, having its first terminal connected to a third clock signal terminal, its second terminal connected to the reference signal terminal, its third terminal connected to the first node, and its fourth terminal connected to the second node, the second control subunit being configured to provide a signal at the third clock signal terminal to the second node under control of the third clock signal terminal only, disconnect the third clock signal terminal from the second node under joint control of the third clock signal terminal and the first node, disconnect the third clock signal terminal from the second node under control of the first node, and provide the signal at the reference signal terminal to the second node under control of the first node.

3. The shift register of claim 2, wherein the first control subunit comprises a first switching transistor having its gate connected to the second node, its source connected to the reference signal terminal and its drain connected to the first node.

4. The shift register of claim 2, wherein the second control subunit comprises a second switching transistor, a third switching transistor, a fourth switching transistor and a fifth switching transistor, wherein
the second switching transistor has its gate and source both connected to the third clock signal terminal and its drain connected to a gate of the third switching transistor and a drain of the fourth switching transistor;
the third switching transistor has its source connected to the third clock signal terminal and its drain connected to the second node;
the fourth switching transistor has its gate connected to the first node and its source connected to the reference signal terminal; and
the fifth switching transistor has its gate connected to the first node, its source connected to the reference signal terminal and its drain connected to the second node.

5. The shift register of claim 1, wherein the input unit comprises a sixth switching transistor having its gate and source both connected to the input signal terminal and its drain connected to the first node.

6. The shift register of claim 1, wherein the first reset unit comprises a seventh switching transistor having its gate connected to the reset signal terminal, its source connected to the reference signal terminal, and its drain connected to the first node.

7. The shift register of claim 1, wherein the gate-shaping control unit comprises:
an eighth switching transistor, having its gate connected to the first gate-shaping control signal terminal, its source connected to the first clock signal terminal, and its drain connected to the first terminal of the first output unit; and
a ninth switching transistor, having its gate connected to the second gate-shaping control signal terminal, its source connected to the second clock signal terminal, and its drain connected to the first terminal of the first output unit.

8. The shift register of claim 1, wherein the first output unit comprises:
a tenth switching transistor, having its gate connected to the first node, its source connected to the first terminal of the first output unit, and its drain connected to the driving signal output terminal; and
a capacitor, having its first terminal connected to the first node and its second terminal connected to the driving signal output terminal.

9. The shift register of claim 1, wherein the second output unit comprises an eleventh switching transistor having its gate connected to the second node, its source connected to the reference signal terminal and its drain connected to the driving signal output terminal.

10. The shift register of claim 1, further comprising:
a second reset unit, having its first terminal connected to the reset signal terminal, its second terminal connected to the reference signal terminal, and its third terminal connected to the driving signal output terminal, the second reset unit being configured to provide the signal at the reference signal terminal to the driving signal output terminal under control of the reset signal terminal.

11. The shift register of claim 10, wherein the second reset unit comprises a twelfth switching transistor having its gate connected to the reset signal terminal, its source connected to the reference signal terminal and its drain connected to the driving signal output terminal.

12. The shift register of claim 2, further comprising:
a first stabilizer unit, having its first terminal connected to the third clock signal terminal, its second terminal connected to the input signal terminal, and its third terminal connected to the first node, the first stabilizer unit being configured to provide the signal at the input signal terminal to the first node under control of the third clock signal terminal.

13. The shift register of claim 12, wherein the first stabilizer unit comprises a thirteenth switching transistor having its gate connected to the third clock signal terminal, its source connected to the input signal terminal and its drain connected to the first node.

14. The shift register of claim 2, further comprising:
a second stabilizer unit, having its first terminal connected to the third clock signal terminal, its second terminal connected to the reference signal terminal, and its third terminal connected to the driving signal output terminal, the second stabilizer unit being configured to provide the signal at the reference signal terminal to the driving signal output terminal under control of the third clock signal terminal.

15. The shift register of claim 14, wherein the second stabilizer unit comprises a fourteenth switching transistor having its gate connected to the third clock signal terminal, its source connected to the reference signal terminal and its drain connected to the driving signal output terminal.

16. A gate driving circuit comprising a plurality of cascaded shift registers according to claim 1, wherein
a first shift register at a first stage of the plurality of cascaded shift registers has its input signal terminal connected to a frame trigger signal terminal,
shift registers at each stage other than the first stage each has its input signal terminal connected to the driving signal output terminal of the shift register at its previous stage, and
shift registers at each stage other than a last stage each has its reset signal terminal connected to the driving signal output terminal of the shift register at its next stage.

17. A display apparatus, comprising the gate driving circuit according to claim 16.

18. The shift register of claim 2, wherein the gate-shaping control unit comprises:
an eighth switching transistor, having its gate connected to the first gate-shaping control signal terminal, its source connected to the first clock signal terminal, and its drain connected to the first terminal of the first output unit; and
a ninth switching transistor, having its gate connected to the second gate-shaping control signal terminal, its source connected to the second clock signal terminal, and its drain connected to the first terminal of the first output unit.

19. The shift register of claim 2, wherein the first output unit comprises:
a tenth switching transistor, having its gate connected to the first node, its source connected to the first terminal of the first output unit, and its drain connected to the driving signal output terminal; and a capacitor, having its first terminal connected to the first node and its second terminal connected to the driving signal output terminal.

20. The shift register of claim 2, further comprising:

A second reset unit, having its first terminal connected to the reset signal terminal, its second terminal connected to the reference signal terminal, and its third terminal connected to the driving signal output terminal, the second reset unit being configured to provide the signal at the reference signal terminal to the driving signal output terminal under control of the rest signal terminal.

* * * * *